United States Patent
Harikai et al.

(10) Patent No.: US 9,698,052 B2
(45) Date of Patent: Jul. 4, 2017

(54) METHOD OF MANUFACTURING ELEMENT CHIP AND METHOD OF MANUFACTURING ELECTRONIC COMPONENT-MOUNTED STRUCTURE USING PLASMA ETCH TO SINGULATE ELEMENT CHIP

(71) Applicant: Panasonic Intellectual Property Management Co., Ltd., Osaka (JP)

(72) Inventors: Atsushi Harikai, Osaka (JP); Shogo Okita, Hyogo (JP); Noriyuki Matsubara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/267,059

(22) Filed: Sep. 15, 2016

(65) Prior Publication Data
US 2017/0098590 A1    Apr. 6, 2017

(30) Foreign Application Priority Data
Oct. 1, 2015    (JP) .................... 2015-195520

(51) Int. Cl.
*H01L 21/78* (2006.01)
*H01L 21/02* (2006.01)
(Continued)

(52) U.S. Cl.
CPC .......... *H01L 21/78* (2013.01); *H01L 21/0212* (2013.01); *H01L 21/3065* (2013.01); *H01L 21/4853* (2013.01); *H01L 21/6835* (2013.01); *H01L 23/293* (2013.01); *H01L 24/32* (2013.01); *H01L 24/83* (2013.01); *H01L 2021/60007* (2013.01); *H01L 2221/6834* (2013.01); *H01L 2221/68327* (2013.01); *H01L 2224/03849* (2013.01); *H01L 2224/26145* (2013.01);
(Continued)

(58) Field of Classification Search
None
See application file for complete search history.

(56) References Cited

U.S. PATENT DOCUMENTS 5,523,920 A * 6/1996 Machuga ............... H05K 1/111
174/261
7,453,155 B2 * 11/2008 Hsu .................. H01L 23/49894
257/737

(Continued)

FOREIGN PATENT DOCUMENTS

JP    2002-093752    3/2002

*Primary Examiner* — Michael Jung
(74) *Attorney, Agent, or Firm* — Pearne & Gordon, LLP (57) ABSTRACT

In a method of manufacturing an element chip for manufacturing a plurality of element chips by dividing a substrate, where the protruding portions, which are exposed element electrodes, are formed on element regions, protection films made of fluorocarbon film are formed on a second surface and side surfaces of the element chip, and a first surface in a gap by exposing the element chip to second plasma after the substrate is divided by etching. Next, the protection films formed on the second surface and the side surfaces of the element chip are removed while leaving at least a part of the protection film formed in the gap by exposing the element chip to third plasma. Therefore, creep-up of a conductive material in a mounting step is suppressed by the left protection film.

4 Claims, 6 Drawing Sheets

(51) Int. Cl.

| | |
|---|---|
| *H01L 21/3065* | (2006.01) |
| *H01L 21/48* | (2006.01) |
| *H01L 21/683* | (2006.01) |
| *H01L 23/29* | (2006.01) |
| *H01L 23/00* | (2006.01) |
| *H01L 21/60* | (2006.01) |

(52) U.S. Cl.
 CPC ............... *H01L 2224/32168* (2013.01); *H01L 2224/83815* (2013.01)

(56) References Cited

U.S. PATENT DOCUMENTS

| | | | | |
|---|---|---|---|---|
| 8,120,188 | B2* | 2/2012 | Sakurai | H01L 24/11 257/778 |
| 9,142,459 | B1* | 9/2015 | Kumar | H01L 21/0337 |
| 2012/0238073 | A1* | 9/2012 | Johnson | H01L 21/3065 438/464 |
| 2012/0322238 | A1* | 12/2012 | Lei | H01L 21/78 438/462 |
| 2013/0344683 | A1* | 12/2013 | Lazerand | H01L 21/67069 438/462 |
| 2014/0134828 | A1* | 5/2014 | Burghout | H01L 21/02076 438/464 |
| 2014/0217556 | A1* | 8/2014 | Peh | H01L 21/78 257/620 |
| 2014/0242780 | A1* | 8/2014 | Gauldin | H01L 21/3065 438/463 |
| 2015/0069591 | A1* | 3/2015 | Fischer | H01L 21/7685 257/676 |
| 2016/0365283 | A1* | 12/2016 | Lei | H01L 21/82 |

* cited by examiner

METHOD OF MANUFACTURING ELEMENT CHIP AND METHOD OF MANUFACTURING ELECTRONIC COMPONENT-MOUNTED STRUCTURE USING PLASMA ETCH TO SINGULATE ELEMENT CHIP

BACKGROUND

1. Technical Field

The present disclosure relates to a method of manufacturing an element chip in which element chips are manufactured by dividing a substrate having a plurality of element regions for each element region and a method of manufacturing an electronic component-mounted structure which is formed by mounting the element chip on a board.

2. Description of the Related Art

An element chip such as a semiconductor element is manufactured by dividing a wafer substrate having a plurality of element regions into individual pieces (for example, see Japanese Patent Unexamined Publication No. 2002-93752 (PTL 1)). In the related art illustrated in PTL 1, first, a back surface of a wafer is polished and the wafer is thinned by etching in a state where a front surface of the wafer is stuck to a dicing tape. Thereafter, a resist layer is formed in a portion corresponding to the element region for masking, and the wafer is subjected to plasma etching, thereby separating the wafer into individual pieces of the semiconductor elements.

SUMMARY

An individual piece of the element chip that is cut out from the wafer substrate in the above-described manner is not only used as a device after being packaged but also may be sent to an electronic component mounting step in a form of the element chip as it is as in a case of flip-chip mounting or the like. In such a case, the element chip is mounted in a manner in which a circuit-formed surface comes directly into contact with a conductive material such as cream solder or silver paste for bonding. In the mounting step, a so-called "creep-up", in which the conductive material, which is pressed and spread when mounting the element chip, spreads not only on a bonding portion of the circuit-formed surface but also on a side surface or a back surface of the element chip may occur. Such creep-up of the conductive material causes various troubles such as short-circuit between adjacent electrodes or an increase in current consumption by forming an unnecessary electric circuit on the side surface of the element chip. Therefore, in such a mounting step, it is required to suppress creep-up of a conductive material.

An object of the disclosure is to provide a method of manufacturing an element chip and a method of manufacturing an electronic component-mounted structure in which creep-up of a conductive material in a mounting step can be suppressed.

A method of manufacturing an element chip of the disclosure, in which a plurality of element chips are manufactured by dividing a substrate, which includes a first surface having a plurality of element regions defined by dividing regions, a second surface on a side opposite to the first surface, and protruding portions which are exposed element electrodes, the protruding portions formed on the element regions, using the dividing regions as boundaries, includes a preparing step and a plasma processing step. The preparing step is a step of preparing the substrate in which the first surface side of the substrate is supported on a carrier and on which an etching-resistant layer is formed so as to cover regions of the second surface opposite to the element regions and to expose regions of the second surface opposite to the dividing regions in a state where gaps are formed between the first surface and the carrier with the protruding portions being in contact with the carrier. The plasma processing step is a step of performing plasma processing on the substrate that is supported on the carrier, after the preparing step. The plasma processing step includes a dividing step, a protection film forming step, and a protection film removing step. The dividing step is a step of dividing the substrate into the element chips by etching regions of the substrate which are not covered by the etching-resistant layer in a depth direction of the substrate up to the first surface by exposing the second surface to first plasma, and causing the element chips each including the first surface, the second surface, and a side surface connecting the first surface and the second surface to be in a state of being held on the carrier with a space between each other. The protection film forming step is a step of forming a protection film on the second surface of the element chip, the side surface of the element chip, and the first surface in the gap by exposing the element chip to second plasma generated during supplying of protection film forming gas in a state where the element chip is held on the carrier with a space between each other after the dividing step. The protection film removing step is a step of removing the protection film, which is formed on the second surface and the side surface of the element chip, while leaving at least a part of the protection film formed in the gap by exposing the element chips to third plasma generated during supplying of protection film etching gas in a state where the element chips are held on the carrier with a space between each other after the protection film forming step.

A method of manufacturing an electronic component-mounted structure of the disclosure, formed by soldering between the protruding portions of the element chip formed by the method of manufacturing an element chip described above and land electrodes formed in a printed circuit board, includes the following steps. That is, the method includes a solder paste supplying step of supplying paste-like solder on the land electrodes; a mounting step of mounting the protruding portions on the printed circuit board by causing the protruding portions to be landed on the solder supplied on the corresponding land electrodes; a melting step of performing soldering between the protruding portions and the land electrodes by melting the solder by heating the printed circuit board; and a cooling step of solidifying the melted solder by cooling the printed circuit board. In the melting step, the protection film in the gap suppresses the melted solder being spread in the gap.

According to the disclosure, it is possible to suppress creep-up of a conductive material in the mounting process.

DETAILED DESCRIPTION

Next, an embodiment of the disclosure will be described with reference to the drawings. First, a method of manufacturing an element chip of the embodiment will be described with reference to FIGS. 1A to 1C and 2A to 2C. The method of manufacturing the element chip illustrated in here is used for manufacturing a plurality of element chips by dividing a substrate which includes a first surface having a plurality of element regions defined by dividing regions and a second surface on a side opposite to the first surface, and in which protruding portions where element electrodes are exposed are formed, into the dividing regions.

Figure 1A:
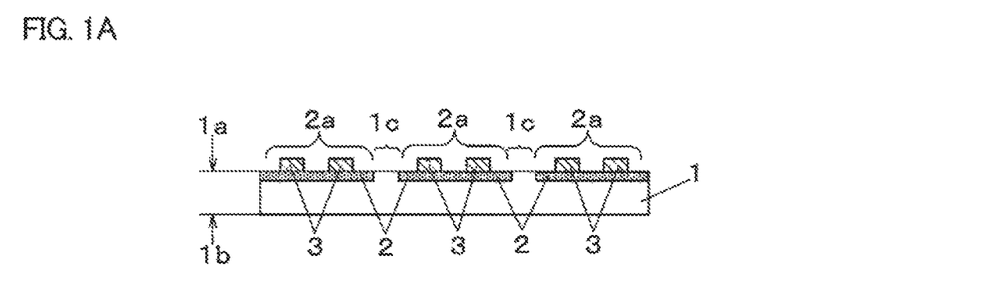
FIG. 1A is a view for explaining a step in a method of manufacturing an element chip of an embodiment of the disclosure and is a sectional view illustrating a substrate before separation.

As illustrated in FIG. 1A, substrate 1 is a wafer substrate where a plurality of element chips 10 (see FIG. 1C) having element portions 2 are formed on first surface 1a. A plurality of element regions 2a which are defined by dividing regions 1c are set in first surface 1a that is an element surface on which element portions 2 are formed in substrate 1. A plurality of protruding portions 3 in which element electrodes for electrical connection are exposed are formed in each of element regions 2a. Substrate 1 is sent to a preparing step for manufacturing the element chips and, as described below, support is performed by carrier 5 and mask formation is performed. As carrier 5, a dicing tape that is held by a dicing frame or a support substrate that includes an adhesive layer in holding surface 5a may be exemplified.

Figure 1B:
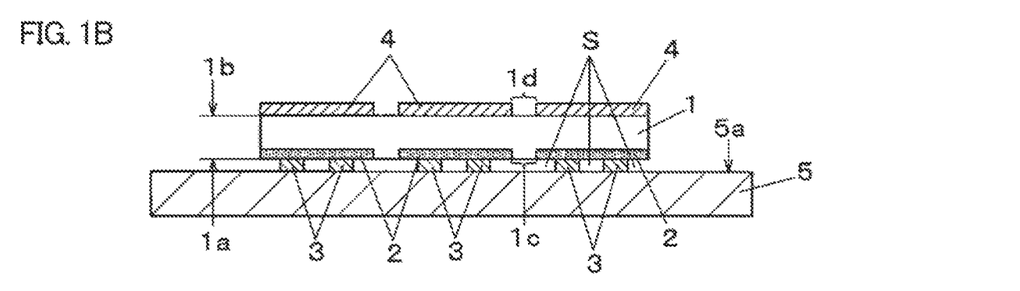
FIG. 1B is a view for explaining a step in the method of manufacturing the element chip of an embodiment of the disclosure and is a sectional view illustrating a preparing step.

In the preparing step, as illustrated in FIG. 1B, in a state where gaps S are formed between first surface 1a and carrier 5 by causing leading end surfaces of protruding portions 3 to be in contact with holding surface 5a of carrier 5, first surface 1a of substrate 1 is supported on holding surface 5a of carrier 5 and etching-resistant layers 4 is formed by a resist mask, a surface protection film, and the like functioning as a mask in plasma dicing on second surface 1b. That is, etching-resistant layers 4 are formed in second surface 1b so as to cover regions of second surface 1b facing element regions 2a and expose regions 1d of second surface 1b facing dividing regions 1c.

Figure 3:
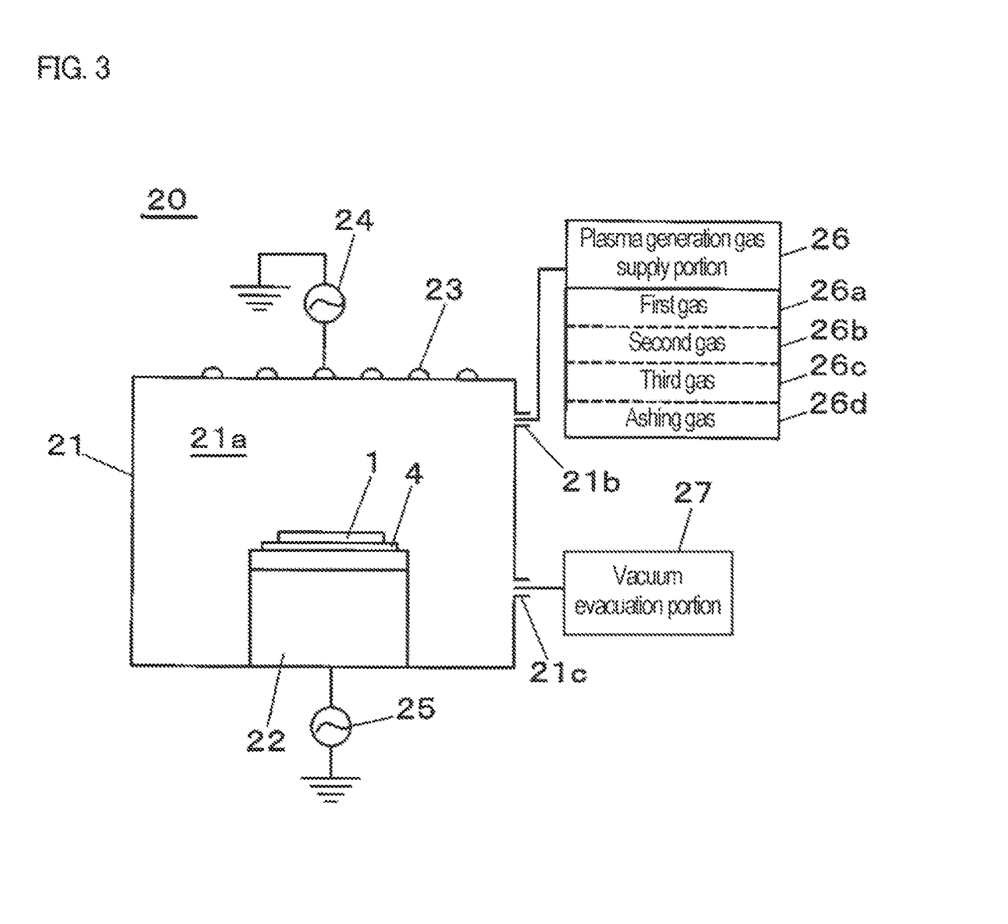
FIG. 3 is a view for explaining a configuration of a plasma etching device that is used in the method of manufacturing the element chip of an embodiment of the disclosure.

After performing the preparing step as described above, in order to perform plasma processing on substrate 1 that is supported on carrier 5, carrier 5 is sent to a plasma processing step. A configuration of plasma etching device 20 that is used in the plasma processing step will be described with reference to FIG. 3. In FIG. 3, an inside of chamber 21 that is a vacuum vessel is processing chamber 21a for performing plasma processing and stage 22, on which carrier 5 supporting substrate 1 that is to be processed is mounted, is disposed on a bottom portion of processing chamber 21a. Antennas 23 as upper electrodes are disposed on an upper surface of a top portion of chamber 21 and antenna 23 is electrically connected to first high-frequency power supply portion 24. Stage 22 within processing chamber 21a also has a function as a lower electrode for performing plasma processing and stage 22 is electrically connected to second high-frequency power supply portion 25.

Vacuum evacuation portion 27 is connected to chamber 21 via exhaust port 21c and the inside of processing chamber 21a is evacuated by driving vacuum evacuation portion 27. Furthermore, plasma generation gas supply portion 26 is connected to processing chamber 21a via gas inlet port 21b. In plasma etching device 20 illustrated in the embodiment, it is possible to selectively supply a plurality of types of plasma generation gas depending on the purpose of plasma processing. Here, as the types of plasma generation gas, first gas 26a, second gas 26b, third gas 26c, and ashing gas 26d may be selected.

As first gas 26a, gas such as $SF_6$ or $C_4F_8$ which are excellent in etching effect for silicon is used. In the embodiment, first gas 26a is used for generating first plasma P1 to divide substrate 1 by plasma etching. Second gas 26b is gas for plasma CVD to form a film by plasma processing and mixed gas of carbon fluoride and helium such as $C_4F_8$, $C_2F_6$, $CF_4$, $C_6F_6$, $C_6F_4H_2$, $CHF_3$, and $CH_2F_2$ is used for second gas 26b. In the embodiment, second gas 26b is used as gas for forming the protection film to form the protection film on the side surface and second surface 1b of element chip 10 obtained by dividing substrate 1, and first surface 1a within gaps S. A flow ratio of helium to a total flow rate of mixed gas is appropriately set according to a combination of the types of gas. As an exemplary value, an example in which the ratio of the flow ratio of helium to the total flow rate of mixed gas is 10% to 80% can be included.

Third gas 26c is gas for the protection film etching and gas which is excellent in physical etching effect such as oxygen gas or argon gas is used. In the embodiment, third gas 26c is used for sputtering applications for removing an unnecessary portion of the protection film described above. Ashing gas 26d is oxygen gas and, in the embodiment, is used for the purpose of removing a resin film such as etching-resistant layer 4 after completing the mask function.

In plasma processing by plasma etching device 20, first, substrate 1 to be processed is mounted on stage 22 together with carrier 5 and the inside of processing chamber 21a is evacuated to be vacuum by driving vacuum evacuation portion 27. At the same time, plasma generation gas depending on the purpose of plasma processing is supplied on the inside of processing chamber 21a by plasma generation gas supply portion 26 and the inside of processing chamber 21a is maintained at a predetermined pressure. In this state, high-frequency power is supplied on antenna 23 by first high-frequency power supply portion 24 and thereby plasma according to the type of plasma generation gas, which is supplied, is generated on the inside of processing chamber 21a. In this case, a bias voltage is applied to stage 22 as the lower electrode by second high-frequency power supply portion 25. Therefore, it is possible to exert a biasing effect for promoting entry of plasma generated on the inside of processing chamber 21a in a direction of stage 22 and to perform anisotropic etching by enhancing a plasma processing effect in a predetermined specific direction.

Figure 1C:
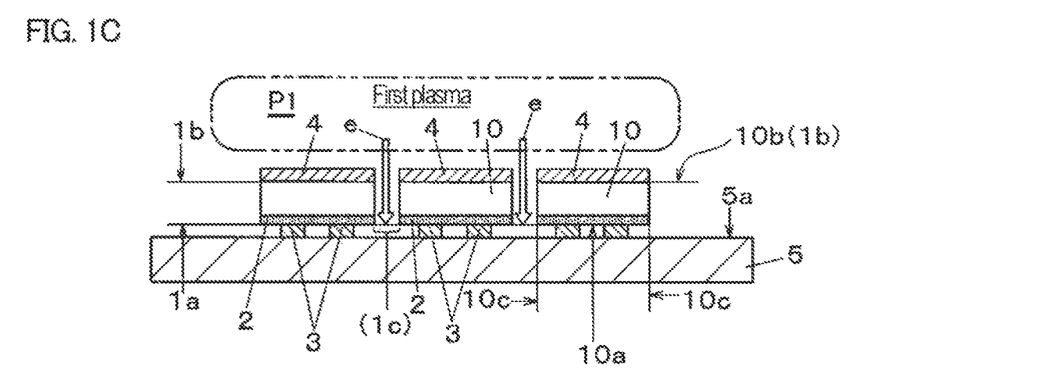
FIG. 1C is a view for explaining a step in the method of manufacturing the element chip of an embodiment of the disclosure and is a sectional view illustrating a step of dividing the substrate by performing plasma processing.

In the plasma processing step, first, processing is executed by first plasma P1 using first gas 26a described above. As illustrated in FIG. 1C, substrate 1 of region 1d (see FIG. 1B) which is not covered by etching-resistant layer 4 is etched (see arrows e) until reaching first surface 1a in the depth direction of substrate 1 by exposing second surface 1b of substrate 1 to first plasma P1 described above, etching grooves 11 (see FIG. 2A) separating each element chip 10 are formed, and substrate 1 is divided into element chips 10 of individual pieces. That is, element chips 10 including first surface 10a that is first surface 1a in the state of substrate 1, second surface 10b that is second surface 1b, and side surface 10c connecting first surface 10a and second surface 10b are in a state of being held spaced from each other on carrier 5 (dividing step.

Etching conditions in the dividing step can be appropriately selected depending on a material of substrate 1. In a case where substrate 1 is a silicon substrate, for etching in the dividing step, a so-called Bosch process can be used. In the Bosch process, it is possible to burrow region 1d that is not covered by etching-resistant layer 4 perpendicular to the depth direction of the substrate by sequentially repeating a deposition film depositing step, a deposition film etching step, and a silicon etching step.

As conditions of the deposition film depositing step, for example, a pressure on the inside of processing chamber is adjusted to 15 to 25 Pa while supplying $C_4F_8$ as raw material gas at 150 to 250 sccm, input power from first high-frequency power supply portion 24 to antenna 23 is 1500 to 2500 W, input power from second high-frequency power supply portion 25 to the lower electrode is 0 W, and a processing time may be 5 to 15 seconds. As conditions of the deposition film etching step, for example, the pressure on the inside of processing chamber is adjusted to 5 to 15 Pa while supplying $SF_6$ as raw material gas at 200 to 400 sccm, input power from first high-frequency power supply portion 24 to antenna 23 is 1500 to 2500 W, input power from second high-frequency power supply portion 25 to the lower electrode is 100 to 300 W, and the processing time may be 2 to 10 seconds. The sccm is a unit representing the flow rate of gas and 1 sccm represents that gas of a standard state (0° C. and 1 atm) flows by 1 $cm^3$ in one minute.

As conditions of the silicon etching step, for example, the pressure on the inside of processing chamber is adjusted to 5 to 15 Pa while supplying $SF_6$ as raw material gas at 200 to 400 sccm, input power from first high-frequency power supply portion 24 to antenna 23 is 1500 to 2500 W, input power from second high-frequency power supply portion 25 to the lower electrode is 50 to 200 W, and the processing time may be 10 to 20 seconds. In these conditions, it is possible to burrow the silicon substrate at a speed of 10 μm/min by repeating the deposition film depositing step, the deposition film etching step, and the silicon etching step.

Figure 2A:
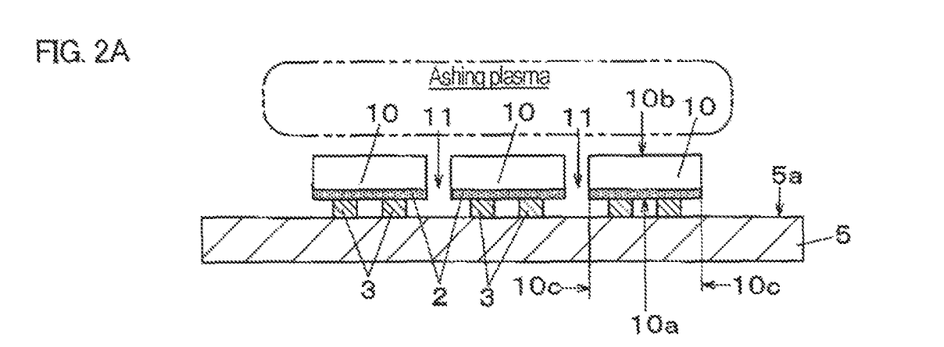
FIG. 2A is a view for explaining a step in the method of manufacturing the element chip of an embodiment of the disclosure and is a sectional view illustrating an ashing step.
Figure 2B:
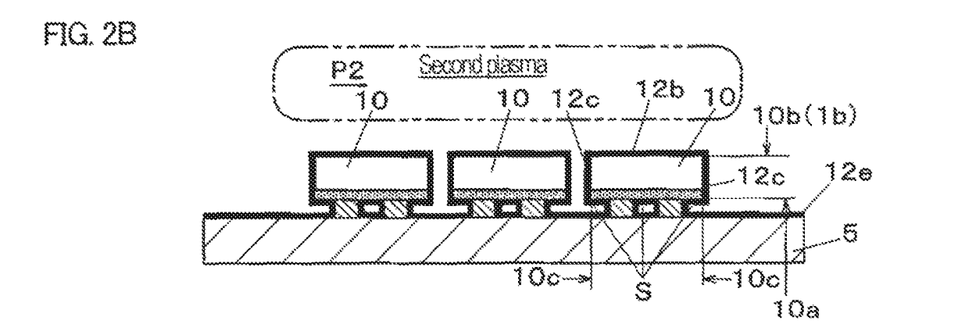
FIG. 2B is a view for explaining a step in the method of manufacturing the element chip of an embodiment of the disclosure and is a sectional view illustrating a protection film forming step.

Thereafter, ashing is performed for removing etching-resistant layer 4 in a state where second surface 10b is covered in element chip 10 of individual piece. That is, as illustrated in FIG. 2A, ashing plasma using ashing gas 26d is generated on the inside of processing chamber 21a in plasma etching device 20 and etching-resistant layer 4 containing resin as a main component is removed by ashing. Therefore, second surfaces 10b of element chips 10 divided into individual pieces are in a state of being exposed.

Conditions of ashing can be appropriately selected in accordance with a material of etching-resistant layer 4. For example, in a case where etching-resistant layer 4 is a resist film, the pressure on the inside of processing chamber is adjusted to 5 to 15 Pa while supplying oxygen at 150 to 300 sccm and supplying $CF_4$ at 0 to 50 sccm as raw material gas, input power from first high-frequency power supply portion 24 to antenna 23 is 1500 to 2500 W, input power from second high-frequency power supply portion 25 to the lower electrode may be 0 to 30 W. In the conditions, it is possible to remove etching-resistant layer 4 at a speed of appropriately 1 μm/min.

Figure 4A:
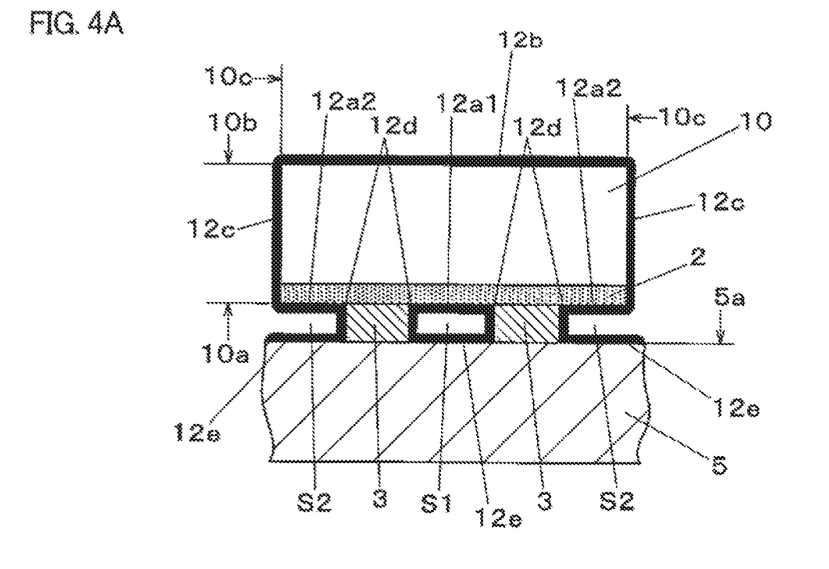
FIG. 4A is an enlarged explanatory view of protection film formation in the method of manufacturing the element chip of an embodiment of the disclosure and is a sectional view illustrating a state where a protection film is formed.

Next, after the dividing step described above, a protection film forming step is performed. That is, in plasma etching device 20, element chips 10 are exposed to second plasma P2 generated while supplying second gas 26b that is protection film forming gas (mixed gas of carbon fluoride and helium) on the inside of processing chamber 21a in a state of being held spaced from each other on carrier 5. Therefore, as illustrated in FIG. 4A, protection films 12b and 12c made of a fluorocarbon film containing fluorine and carbon, which are obtained by decomposing carbon fluoride in protection film forming gas in plasma and then being deposited and coated, are formed on each of second surface 10b and side surfaces 10c of element chip 10. The same protection films are also formed in gaps S between first surface 10a and carrier 5.

That is, in gap S1 of gaps S positioned between adjacent protruding portions 3, protection film 12a1 is formed on first surface 10a, protection film 12d is formed on the side surfaces of protruding portion 3, and protection film 12e is formed on holding surface 5a of carrier 5. In gaps S2 of gaps S positioned outside protruding portion 3, protection film 12a2 is formed on first surface 10a, protection film 12d is formed on the side surfaces of protruding portion 3, and protection film 12e is formed on holding surface 5a of carrier 5.

These protection films are formed for the purpose of suppressing creep-up of a conductive material in the mounting process for directly bonding element chip 10 to a package substrate and the like. Therefore, it is preferable that the protection films have less hygroscopicity and dense composition. In the embodiment, as raw material gas of second plasma P2 used for forming the protection films, since protection film forming gas containing mixed gas of carbon fluoride and helium is used, it is possible to form the protection films made of fluorocarbon film which has less hygroscopicity and dense composition, and excellent in adhesion. In the protection film forming step, high-frequency bias is applied to stage 22 (see FIG. 3) on which carrier 5 is mounted. Therefore, incidence of ions into element chip 10 is promoted and it is possible to form the protection film having more dense composition and high adhesion.

As conditions of the protection film formation, for example, the pressure on the inside of processing chamber is adjusted to 15 to 25 Pa while supplying $C_4F_8$ at 150 sccm and He at 50 sccm as raw material gas, input power from first high-frequency power supply portion 24 to antenna 23 is 1500 to 2500 W, input power from second high-frequency power supply portion 25 to the lower electrode may be 50 to 150 W. In the conditions, it is possible to form the protection film having a thickness of 3 μm by being processed for 300 seconds.

In the embodiment, as raw material gas, mixed gas of carbon fluoride and helium is used and this is because dissociation of raw material gas is promoted in plasma by mixing helium and, as a result, it is possible to form the protection film which is dense and has high adhesion.

In the condition examples described above, the ratio of the flow ratio of He to the total flow rate of raw material gas is 25% (=50/(150+50)×100). As described below, it is preferable that the ratio is between 10% and 80%. That is, if the ratio of the flow ratio of He to the total flow rate of raw material gas is greater than 10%, dissociation of raw material gas is likely to be promoted in plasma and, as a result, the protection film which is more dense and has high adhesion is likely to be formed. On the other hand, if the ratio of the flow ratio of He to the total flow rate of raw material gas is greater than 80%, the ratio of $C_4F_8$ occupied in raw material gas is reduced. Therefore, supply of components (C, F, and compounds thereof) in plasma contributing to the protection film formation to the surface of the substrate is insufficient, a deposition ratio of the protection film on the surface of the substrate is slow, and productivity is lowered.

Figure 2C:
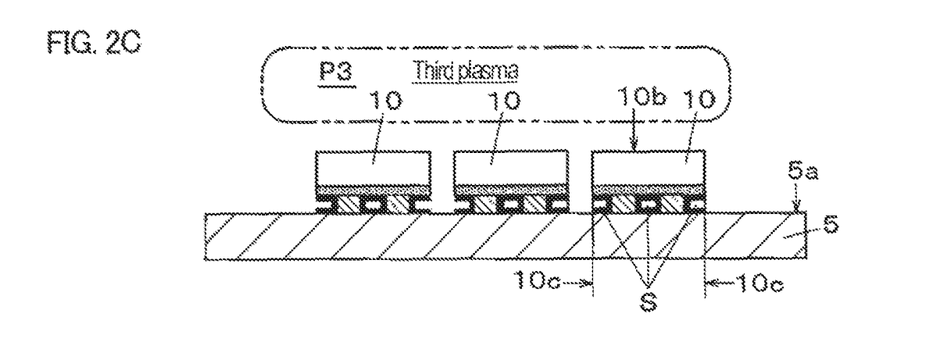
FIG. 2C is a view for explaining a step in the method of manufacturing the element chip of an embodiment of the disclosure and is a sectional view illustrating a plasma processing step.

Next, a protection film removing step for removing an unnecessary portion of the protection film formed in the protection film forming step is performed. In the protection film forming step described above, protection film 12b is also formed on side surfaces 10c and second surface 10b together with first surface 10a of element chip 10 (see FIG. 2B). In the embodiment, since protection films 12b and 12c are not necessary, plasma processing is performed using third plasma P3 for removing the films. That is, in plasma etching device 20, third plasma P3 are generated while supplying third gas 26c that is protection film etching gas of which components are argon gas and oxygen gas on the inside of processing chamber 21a. As illustrated in FIG. 2C, element chips 10 are exposed to third plasma P3 in a state of being held spaced from each other on carrier 5. Therefore, at least a part of the protection film formed in gaps S is left and protection film 12b that is formed on second surface 10b exposed on the upper surface in element chip 10 and protection film 12c that is formed on side surfaces 10c are removed by an etching operation of third plasma P3.

Figure 4B:
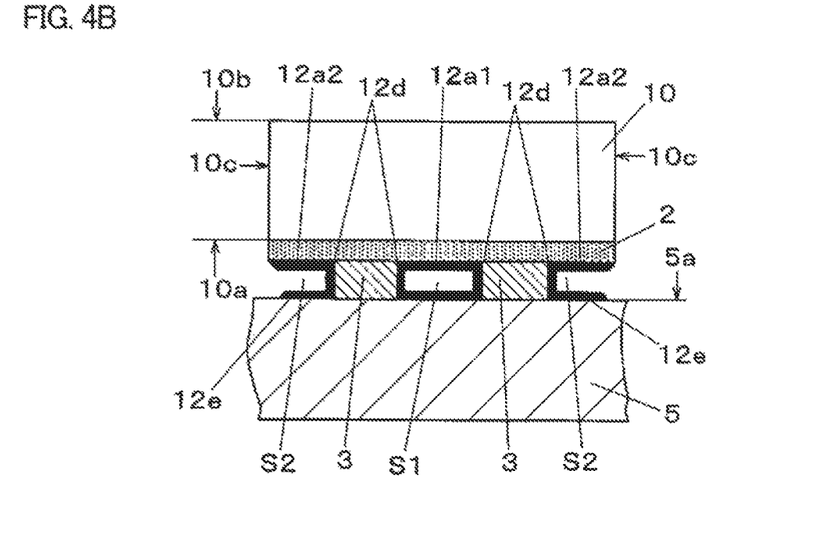
FIG. 4B is an enlarged explanatory view of the protection film formation in the method of manufacturing the element chip of an embodiment of the disclosure and is a sectional view illustrating a state where the protection film is removed.

Therefore, as illustrated in FIG. 4B, second surface 10b and side surfaces 10c of element chip 10 are in a state of being exposed. Protection film 12e of a range in which element chip 10 is not covered among protection films 12e which is adhered on the upper surface of carrier 5 is also removed. In gap S1 of gaps S which is positioned between adjacent protruding portions 3, protection film 12a1 of first surface 10a and protection films 12d of the side surfaces of protruding portion 3 are left. In addition, in gap S2 of gaps S which is positioned outside protruding portion 3, each of protection film 12a2 of first surface 10a and protection film 12d on the side surfaces of protruding portion 3 is left without being removed.

As conditions of removing of the protection film, for example, the pressure on the inside of processing chamber is adjusted to 0.2 to 1.5 Pa while supplying Ar at 150 to 300 sccm and $O_2$ at 0 to 150 sccm as raw material gas, input power from first high-frequency power supply portion 24 to antenna 23 is 1500 to 2500 W, input power from second high-frequency power supply portion 25 to the lower electrode may be 150 to 300 W. In the conditions, it is possible to etch the protection film exposed to the upper surface at a speed of appropriately 0.5 μm/min.

Figure 5:
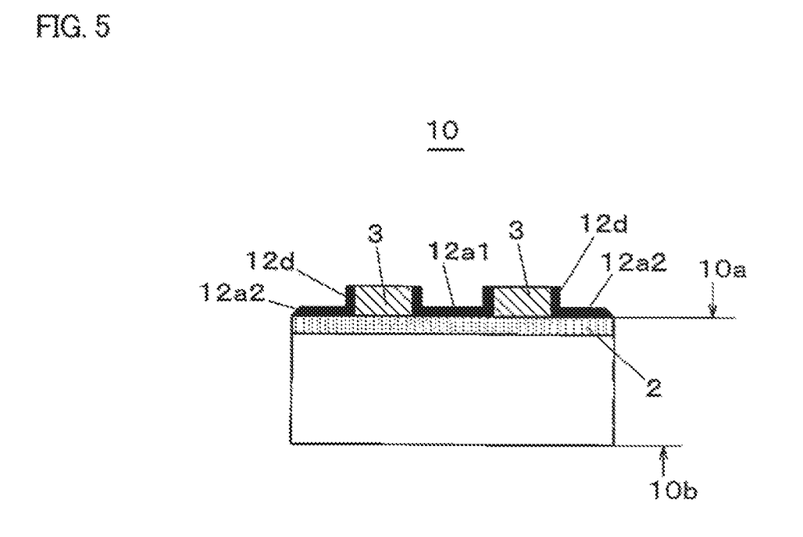
FIG. 5 is a view for explaining a configuration of the element chip manufactured by the method of manufacturing the element chip of an embodiment of the disclosure.

FIG. 5 illustrates element chip 10 that is manufactured by the method of manufacturing described above. That is, element chip 10 taken out from carrier 5 to each of the individual pieces is provided with protection films 12a1 and 12a2 on first surface 10a, has protection films 12d covering the side surfaces of protruding portion 3, and the upper surface of protruding portion 3 is exposed. In FIG. 4B, protection films 12e remaining on holding surface 5a of carrier 5 of a range that is covered by element chip 10 are firmly adhered to holding surface 5a of carrier 5. On the other hand, in FIG. 4B, protection films 12d covering the side surfaces of protruding portion 3 are firmly adhered on the side surfaces of protruding portion 3.

Therefore, when taking out element chip 10 from carrier 5 to each of the individual pieces, protection films 12e remaining on holding surface 5a of carrier 5 are separated from element chip 10. As described below, in a case where element chip 10 having such a configuration forms the electronic component-mounted structure by directly mounting on the printed circuit board and the like by soldering without going through a step of resin packaging and the like, spreading of the conductive material such as cream solder on first surface 10a is suppressed and an effect, in which creep-up of a conductive material is prevented, is provided.

Figure 6A:
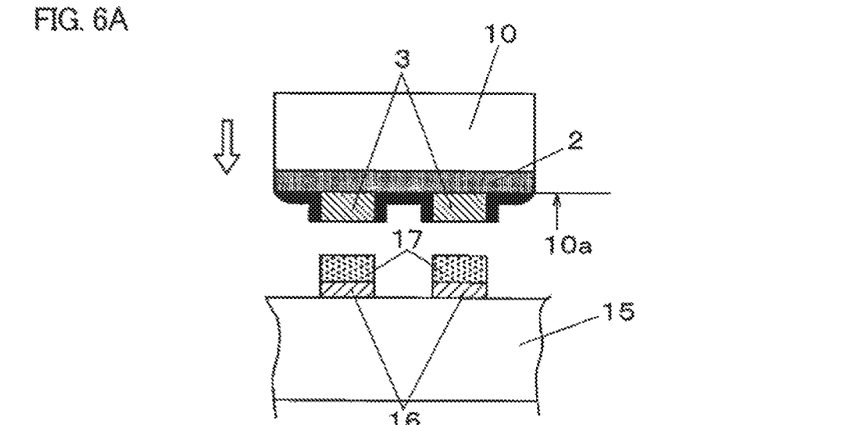
FIG. 6A is a view for explaining a step in a method of manufacturing an electronic component-mounted structure of an embodiment of the disclosure and is a sectional view illustrating a paste supplying step.
Figure 6B:
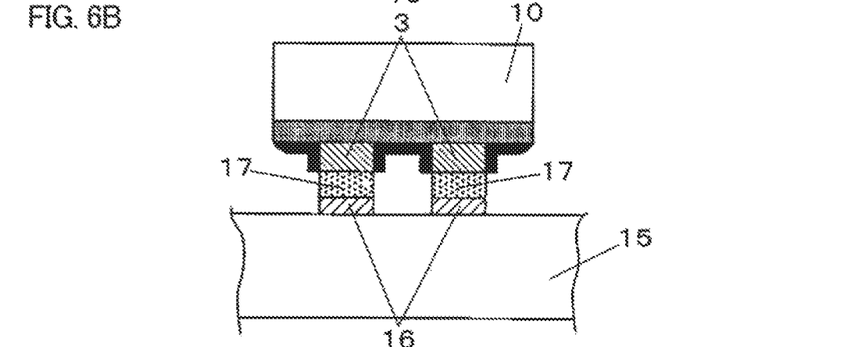
FIG. 6B is a view for explaining a step in the method of manufacturing the electronic component-mounted structure of an embodiment of the disclosure and is a sectional view illustrating an element chip mounting step.
Figure 6C:
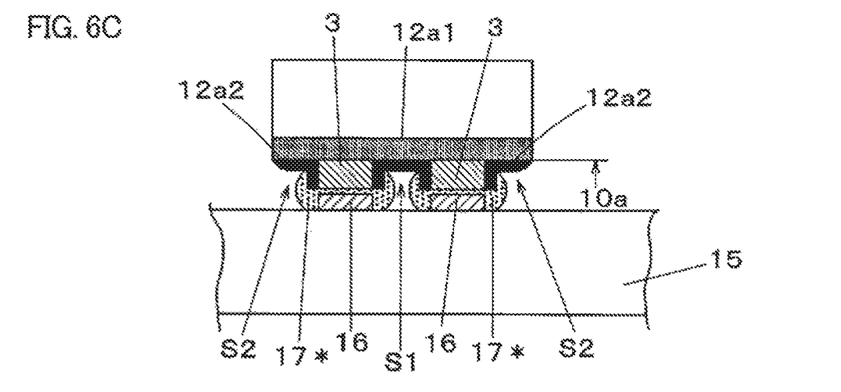
FIG. 6C is a view for explaining a step in the method of manufacturing the electronic component-mounted structure of an embodiment of the disclosure and is a sectional view illustrating a cooling step.

Hereinafter, a method of manufacturing an electronic component-mounted structure, which is formed by performing soldering the element chip 10 formed by the method of manufacturing the element chip described above to land electrodes formed in the printed circuit board, will be described with reference to FIGS. 6A to 6C. in FIG. 6A, land electrodes 16 are formed on an upper surface of printed circuit board 15 corresponding to protruding portions 3 that are the element electrodes for connecting element chip 10. Paste-like solder 17 is supplied on land electrode 16 before mounting element chip 10 (paste supplying step).

Element chip 10 is mounted on printed circuit board 15 after the paste supplying step (mounting step). That is, protruding portions 3 of element chip 10 are aligned to corresponding land electrodes 16 and, as illustrated in FIG. 6B, protruding portions 3 are landed on the solders 17 on land electrodes 16. Therefore, element chip 10 is mounted on printed circuit board 15.

Next, printed circuit board 15 after the mounting step is sent to a reflow step and here, heating is performed for soldering. That is, printed circuit board 15 is heated, solders 17 are melted, and thereby protruding portions 3 and land electrodes 16 are solder-jointed (melting step). Thereafter, printed circuit board 15 is cooled and melted solder is cooled and solidified (cooling step). Therefore, as illustrated in FIG. 6C, soldering portions 17* for solder-jointing protruding portions 3 and land electrodes 16 are formed.

As described above, in gaps S1 and S2, since protection films 12a1 and 12a2 remain on first surface 10a, solders 17 are melted and melted solders are in contact with protection films 12a1 and 12a2 in the melting step. Surface properties of protection films 12a1 and 12a2 have a property of suppressing spreading of the melted solder. Therefore, the melted solders in which solders 17 are melted in the melting step are cooled and solidified around protruding portions 3 and land electrodes 16 without spreading along first surface 10a within gaps S1 and S2, and good soldering portions 17* are formed. That is, in the melting step described above, protection films 12a1 and 12a2 of gaps S1 and S2 are suppressed to be spread in gaps S1 and S2 of melted solders 17.

The method of manufacturing the element chip and the method of manufacturing the electronic component-mounted structure of the disclosure have the effect that creep-up of a conductive material can be suppressed in the mounting step and are useful in a field of manufacturing the element chips by dividing the substrate having the plurality of element regions for each of the element regions.

What is claimed is:

1. A method of manufacturing an element chip, in which a plurality of element chips are manufactured by dividing a substrate, which includes a first surface having a plurality of element regions defined by dividing regions, a second surface on a side opposite to the first surface, and protruding portions which are exposed element electrodes, the protruding portions formed on the element regions using the dividing regions as boundaries, the method comprising:

a preparing step of preparing the substrate in which the first surface side of the substrate is supported on a carrier and on which an etching-resistant layer is formed on the second surface so as to cover regions of the second surface opposite to the element regions and to expose regions of the second surface opposite to the dividing regions in a state where gaps are formed between the first surface and the carrier with the protruding portions being in contact with the carrier; and a plasma processing step of performing plasma processing on the substrate that is supported on the carrier, after the preparing step, wherein the plasma processing step includes a dividing step of dividing the substrate into the element chips by etching regions of the substrate which are not covered by the etching-resistant layer in a depth direction of the substrate up to the first surface by exposing the second surface to first plasma, and causing the element chips each including the first surface, the second surface, and a side surface connecting the first surface and the second surface to be in a state of being held on the carrier with a space between each other, a protection film forming step of forming a protection film on the second surface of the element chip, the side surface of the element chip, and the first surface in the gaps by exposing the element chips to second plasma generated by supplying protection film forming gas in a state where the element chip is held on the carrier with the space between each other after the dividing step, and a protection film removing step of removing the protection film, which is formed on the second surface and the side surface of the element chip, while leaving at least a part of the protection film formed in the gaps by exposing the element chip to third plasma generated by supplying protection film etching gas in a state where the element chips are held on the carrier with the space between each other after the protection film forming step.

2. The method of manufacturing an element chip of claim 1, wherein the protection film is a fluorocarbon film.

3. The method of manufacturing an element chip of claim 2, wherein the protection film forming gas contains carbon fluoride.

4. A method of manufacturing an electronic component-mounted structure formed by soldering between the protruding portions of an element chip and land electrodes formed in a printed circuit board, wherein the element chip, in which a plurality of element chips are manufactured by dividing a substrate, includes a first surface having a plurality of element regions defined by dividing regions, a second surface on a side opposite to the first surface, and protruding portions which are exposed element electrodes, the protruding portions formed on the element regions using the dividing regions as boundaries, the method comprising:

a preparing step of preparing the substrate in which the first surface side of the substrate is supported on a carrier and on which an etching-resistant layer is formed on the second surface so as to cover regions of the second surface opposite to the element regions and to expose regions of the second surface opposite to the dividing regions in a state where gaps are formed between the first surface and the carrier with the protruding portions being in contact with the carrier; and a plasma processing step of performing plasma processing on the substrate that is supported on the carrier, after the preparing step, wherein the plasma processing step includes a dividing step of dividing the substrate into the element chips by etching regions of the substrate which are not covered by the etching-resistant layer in a depth direction of the substrate up to the first surface by exposing the second surface to first plasma, and causing the element chips each including the first surface, the second surface, and a side surface connecting the first surface and the second surface to be in a state of being held on the carrier with a space between each other, a protection film forming step of forming a protection film on the second surface of the element chip, the side surface of the element chip, and the first surface in the gaps by exposing the element chips to second plasma generated by supplying protection film forming gas in a state where the element chip is held on the carrier with the space between each other after the dividing step, and a protection film removing step of removing the protection film, which is formed on the second surface and the side surface of the element chip, while leaving at least a part of the protection film formed in the gaps by exposing the element chip to third plasma generated by supplying protection film etching gas in a state where the element chips are held on the carrier with the space between each other after the protection film forming step, the method further comprising:

a printed circuit board preparing step of preparing a printed circuit board;

a solder paste supplying step of supplying paste-like solder on the land electrodes;

a mounting step of mounting the protruding portions on the printed circuit board by causing the protruding portions to be landed on the paste-like solder supplied on the corresponding land electrodes;

a melting step of performing soldering between the protruding portions and the land electrodes by melting the solder by heating the printed circuit board; and a cooling step of solidifying the melted solder by cooling the printed circuit board, wherein in the melting step, the part of the protection film left in the protection film removing step in the gaps suppresses the melted solder being spread in the gaps.

* * * * *